(12) United States Patent
Ahmavaara et al.

(10) Patent No.: US 10,790,903 B2
(45) Date of Patent: Sep. 29, 2020

(54) DISTRIBUTED RADIO ACCESS NETWORKS (RANS) SUPPORTING COORDINATED AMPLIFIER GAIN OPTIMIZATION

(71) Applicant: Corning Optical Communications LLC, Charlotte, NC (US)

(72) Inventors: Kalle Ahmavaara, San Diego, CA (US); Shirish Nagaraj, Pleasanton, CA (US); Deepak Pengoria, Milpitas, CA (US)

(73) Assignee: Corning Optical Communications LLC, Charlotte, NC (US)

( * ) Notice: Subject to any disclaimer, the term of this patent is extended or adjusted under 35 U.S.C. 154(b) by 0 days.

(21) Appl. No.: 16/268,780

(22) Filed: Feb. 6, 2019

(65) Prior Publication Data
US 2020/0252129 A1   Aug. 6, 2020

(51) Int. Cl.
| | | |
|---|---|---|
| *H04B 10/2575* | (2013.01) | |
| *H04L 25/02* | (2006.01) | |
| *H04B 1/40* | (2015.01) | |
| *H04B 17/00* | (2015.01) | |
| *H04W 24/02* | (2009.01) | |
| *H04W 52/24* | (2009.01) | |
| *H04W 72/12* | (2009.01) | |

(Continued)

(52) U.S. Cl.
CPC ......... *H04B 10/25752* (2013.01); *H04B 1/40* (2013.01); *H04B 17/0085* (2013.01);
(Continued)

(58) Field of Classification Search
CPC ................ H04B 10/25752; H04B 1/40; H04B 17/0085; H04L 25/025; H04L 12/825;
(Continued)

(56) References Cited

U.S. PATENT DOCUMENTS 2,784,400 A * 3/1957 Ehrenfried .......... G01S 13/4436
342/80
7,124,041 B1 * 10/2006 Johnson ................ G05B 9/02
702/58

(Continued)

FOREIGN PATENT DOCUMENTS

EP            2485523 A1    8/2012

OTHER PUBLICATIONS

International Search Report and Written Opinion of the International Searching Authority dated Apr. 23, 2020; 14 Pages; European Patent Office.

*Primary Examiner* — Abbas H Alagheband
(74) *Attorney, Agent, or Firm* — C. Keith Montgomery

(57) ABSTRACT

A distributed radio access network (RAN) is provided. A selected wireless transceiver node(s) in a selected coverage cell receives a radio frequency (RF) test signal(s). The selected wireless transceiver node(s) determines an effective gain value based on a predefined characteristic of the RF test signal(s). The selected wireless transceiver node(s) communicates the effective gain value and other related parameters to a server apparatus in the distributed RAN. The server apparatus determines a common gain value for the selected wireless transceiver node(s) in the selected coverage cell based on the parameters. Accordingly, the selected wireless transceiver node(s) operates based on the common gain value. By determining a respective common gain value for each of the coverage cells in the distributed RAN, it may be possible for all the wireless transceiver nodes in the distributed RAN to communicate an uplink digital communications signal(s) without causing distortion in the uplink digital communications signal(s).

18 Claims, 6 Drawing Sheets

(51) Int. Cl.
  *H04L 27/36* (2006.01)
  *H03G 3/30* (2006.01)
(52) U.S. Cl.
  CPC .............. *H04L 25/025* (2013.01); *H03G 3/30* (2013.01); *H04L 27/36* (2013.01); *H04W 24/02* (2013.01); *H04W 52/24* (2013.01); *H04W 72/12* (2013.01)
(58) Field of Classification Search
  CPC ........ H04L 12/24; H04L 29/06; H04M 1/725; H04W 24/00; H04W 4/40; H04W 24/02; H04W 72/08; H04W 36/16; H01Q 1/24
  USPC .......................................................... 398/115
  See application file for complete search history.

(56) References Cited

U.S. PATENT DOCUMENTS

| | | | |
|---|---|---|---|
| 9,379,930 B2 * | 6/2016 | Chen | H04B 17/14 |
| 9,838,227 B2 * | 12/2017 | Sahin | H04B 7/0456 |
| 9,894,675 B2 * | 2/2018 | Hageltorn | H04W 72/1215 |
| 9,979,451 B2 * | 5/2018 | Sahin | C07D 307/12 |
| 9,998,310 B2 * | 6/2018 | Barbieri | H04L 25/02 |
| 10,168,996 B1 * | 1/2019 | Reulet | G06F 7/588 |
| 10,355,895 B2 * | 7/2019 | Barbieri | H04L 27/26 |
| 10,523,321 B2 * | 12/2019 | Chamarti | H04B 10/116 |
| 2004/0152429 A1 * | 8/2004 | Haub | H04B 1/1027 455/102 |
| 2009/0135732 A1 * | 5/2009 | Maxson | H04L 43/50 370/252 |
| 2010/0075709 A1 | 3/2010 | Nakano et al. | |
| 2016/0352612 A1 | 12/2016 | Daniel | |
| 2017/0373890 A1 * | 12/2017 | Fertonani | H04L 25/02 |
| 2018/0013581 A1 * | 1/2018 | Fertonani | H04L 69/40 |
| 2018/0083811 A1 * | 3/2018 | Kumpula | H04L 25/03159 |
| 2018/0145750 A1 * | 5/2018 | Chamarti | H04W 72/04 |
| 2018/0295588 A1 * | 10/2018 | Abdelmonem | H04J 11/005 |
| 2019/0037418 A1 * | 1/2019 | Gunasekara | H04W 52/40 |
| 2019/0341896 A1 * | 11/2019 | Buer | H03G 3/3042 |
| 2019/0342014 A1 * | 11/2019 | Chapman | H04B 17/24 |

* cited by examiner

DISTRIBUTED RADIO ACCESS NETWORKS (RANS) SUPPORTING COORDINATED AMPLIFIER GAIN OPTIMIZATION

BACKGROUND

The disclosure relates generally to mobile communications systems and related networks, such as Universal Mobile Telecommunications Systems (UMTSs), its offspring Long Term Evolution (LTE) and $5^{th}$ Generation New Radio (5G-NR) described and being developed by the Third Generation Partnership Project (3GPP), and more particularly to radio access networks (RANs) and user mobile communication devices connecting thereto, including small cell RANs, implemented in such mobile communications systems.

Operators of mobile systems, such as UMTS and its offspring including LTE and LTE-Advanced, are increasingly relying on wireless small cell RANs in order to deploy for example indoor voice and data services to enterprises and other customers. Such small cell RANs typically utilize multiple-access technologies capable of supporting communications with multiple users using radio frequency (RF) signals and sharing available system resources such as bandwidth and transmit power. Evolved universal terrestrial radio access (E-UTRA) is the radio interface of 3GPP's LTE upgrade path for UMTS mobile networks. In these systems, there are different frequencies where LTE (or E-UTRA) can be used, and in such systems, user mobile communications devices connect to a serving system, which is represented by a cell. In LTE, each cell is produced by a node called eNodeB (eNB).

In this regard, FIG. 1 is a schematic diagram of an exemplary mobile telecommunications environment 100 (also referred to as "environment 100") that includes exemplary macrocell radio access networks (RANs) 102(1)-102(M) ("macrocells 102(1)-102(M)") and an exemplary small cell RAN 104 located within an enterprise environment 106 and configured to service mobile communications between a user mobile communications device 108(1)-108(N) to a mobile network operator (MNO) 110. A serving RAN for a user mobile communications devices 108(1)-108(N) is a RAN or cell in the RAN in which the user mobile communications devices 108(1)-108(N) have an established communications session with the exchange of mobile communications signals for mobile communications. Thus, a serving RAN may also be referred to herein as a serving cell. For example, the user mobile communications devices 108(3)-108(N) in FIG. 1 are being serviced by the small cell RAN 104, whereas user mobile communications devices 108(1) and 108(2) are being serviced by the macrocells 102(1)-102(M). The macrocells 102(1)-102(M) are mobile network operation (MNO) macrocells in this example. However, a shared spectrum RAN 103 (also referred to as "shared spectrum cell 103") includes a macrocell in this example and supports communications on frequencies that are not solely licensed to a particular MNO and thus may service user mobile communications devices 108(1)-108(N) independent of a particular MNO. For example, the shared spectrum cell 103 may be operated by a third party that is not an MNO and wherein the shared spectrum cell 103 support citizens broadband radio service (CBRS). Also, as shown in FIG. 1, the MNO macrocells 102(1)-102(M), the shared spectrum cell 103, and the small cell RAN 104 may be neighboring radio access systems to each other, meaning that some or all can be in proximity to each other such that a user mobile communications device 108(3)-108(N) may be able to be in communications range of two or more of the MNO macrocells 102(1)-102(M), the shared spectrum cell 103, and the small cell RAN 104 depending on the location of user mobile communications devices 108(3)-108(N).

In a non-limiting example, the mobile telecommunications environment 100 is arranged as an LTE system as described by 3GPP as an evolution of the GSM/UMTS standards (Global System for Mobile communication/Universal Mobile Telecommunications System). It is emphasized, however, that the aspects described herein may also be applicable to other network types and protocols. The mobile telecommunications environment 100 includes the enterprise 106 in which the small cell RAN 104 is implemented. The small cell RAN 104 includes a plurality of wireless transceiver nodes 112(1)-112(C), which are also referred interchangeably as small cell radio nodes (RNs). Each of the wireless transceiver nodes 112(1)-112(C) has a radio coverage area (graphically depicted in the drawings as a hexagonal shape) that is commonly termed a "small cell." A small cell may also be referred to as a femtocell, or using terminology defined by 3GPP as a Home Evolved Node B (HeNB). In the description that follows, the term "cell" typically means the combination of a radio node and its radio coverage area unless otherwise indicated.

The size of the enterprise 106 and the number of cells deployed in the small cell RAN 104 may vary. In typical implementations, the enterprise 106 can be from 50,000 to 500,000 square feet and encompass multiple floors, and the small cell RAN 104 may support hundreds to thousands of users using mobile communications platforms such as mobile phones, smartphones, tablet computing devices, and the like shown as the user mobile communications devices 108(3)-108(N). However, the foregoing is intended to be illustrative and the solutions described herein can be typically expected to be readily scalable either upwards or downwards as the needs of a particular usage scenario demand.

In FIG. 1, the small cell RAN 104, which may also be referred generally as a distributed RAN, includes one or more services nodes (represented as a single services node 114 in FIG. 1) that manage and control the wireless transceiver nodes 112(1)-112(C). In alternative implementations, the management and control functionality may be incorporated into a radio node, distributed among nodes, or implemented remotely (i.e., using infrastructure external to the small cell RAN 104). The wireless transceiver nodes 112(1)-112(C) are coupled to the services node 114 over a direct or local area network (LAN) connection 116 as an example typically using secure IPsec tunnels. The services node 114 aggregates voice and data traffic from the wireless transceiver nodes 112(1)-112(C) and provides connectivity over an IPsec tunnel to a security gateway (SeGW) 118 in an Evolved Packet Core (EPC) network 120 of the MNO 110. The EPC network 120 is typically configured to communicate with a public switched telephone network (PSTN) 122 to carry circuit-switched traffic, as well as for communicating with an external packet-switched network such as the Internet 124.

The environment 100 also generally includes an Evolved Node B (eNB) base station, or "macrocell" 102. The radio coverage area of the macrocell 102 is typically much larger than that of a small cell where the extent of coverage often depends on the base station configuration and surrounding geography. Thus, a given user mobile communications device 108(3)-108(N) may achieve connectivity to the EPC network 120 through either a macrocell 102 or any one of the wireless transceiver nodes 112(1)-112(C) in the small cell RAN 104 in the environment 100.

No admission is made that any reference cited herein constitutes prior art. Applicant expressly reserves the right to challenge the accuracy and pertinency of any cited documents.

SUMMARY

Embodiments of the disclosure relate to a distributed radio access network (RAN) supporting coordinated amplifier gain optimization. The distributed RAN includes a server apparatus and a number of wireless transceiver nodes (e.g., small cell radio nodes) coupled to the server apparatus via a communication medium (e.g., an optical fiber-based communication medium). The distributed RAN is configured to form a number of coverage cells, each consisting of a wireless transceiver node(s), such as a low-power radio(s) (LPR(s)). The wireless transceiver node(s) in a coverage cell is configured to receive and convert an uplink radio frequency (RF) communications signal(s) into an uplink digital communications signal(s) for communication to the server apparatus over the communication medium. In this regard, the wireless transceiver node(s) includes an analog-to-digital converter(s) (ADC(s)) for converting the uplink RF communications signal(s) into the uplink digital communications signal(s). Notably, the ADC(s) typically operates in a defined dynamic range, which defines minimum and maximum power amplitude of the uplink RF communications signal(s) that the ADC(s) can process without causing distortion (e.g., amplitude clipping) in the uplink digital communications signal(s). As such, the wireless transceiver node(s) may employ a variable gain amplifier(s) (VGA(s)) to adjust the power amplitude of the uplink RF communications signal(s) to the defined dynamic range of the ADC(s) prior to converting the uplink RF communications signal(s) into the uplink digital communications signal(s). In this regard, the VGA(s) can be set to an effective gain level(s) so determined to adjust the power amplitude of the uplink RF communications signal(s) to the defined dynamic range of the ADC(s). As a result, it may be possible to prevent the uplink digital communications signal(s) from being distorted by the ADC(s) regardless of actual power amplitude of the uplink RF communications signal(s).

In examples discussed herein, the server apparatus is configured to determine a common gain value for the VGA(s) in the wireless transceiver node(s) located in the coverage cell to prevent the ADC(s) in the wireless transceiver node(s) from distorting the uplink digital communications signal(s). In this regard, a selected wireless transceiver node(s) in a selected coverage cell is configured to receive an RF test signal(s) from a second selected wireless transceiver node(s) in a second selected coverage cell (e.g., a neighboring coverage cell). The selected wireless transceiver node(s) determines a predefined characteristic of the RF test signal(s). Accordingly, the selected wireless transceiver node(s) determines an effective gain value that falls within an effective gain range(s) of the VGA(s) based on the predefined characteristic of the RF test signal(s). The selected wireless transceiver node(s) communicates the effective gain value, together with other related parameters, such as the effective gain range(s), to the server apparatus. The server apparatus is configured to determine a common gain value for the selected wireless transceiver node(s) located in the selected coverage cell based on the parameters reported by the selected wireless transceiver node(s) and communicate the common gain value to the selected wireless transceiver node(s) in the selected coverage cell. Accordingly, the selected wireless transceiver node(s) in the selected coverage cell configures the VGA(s) to operate based on the common gain value determined by the server apparatus. By determining a respective common gain value for each of the coverage cells in the distributed RAN, it may be possible for all the wireless transceiver nodes in the distributed RAN to communicate the uplink digital communications signal(s) without causing distortion in the uplink digital communications signal(s), thus helping to improve performance and user experience in the distributed RAN.

In one aspect, a wireless transceiver node in a distributed RAN is provided. The wireless transceiver node includes a communication interface coupled to a server apparatus via a communication medium. The wireless transceiver node also includes a receive circuit coupled to the communication interface, the receive circuit configured to receive at least one RF test signal in a selected receive band in a maintenance mode. The wireless transceiver node also includes a controller communicatively coupled to the communication interface and the receive circuit. The controller is configured to receive the at least one RF test signal from the receive circuit. The controller is also configured to determine a predefined characteristic of the at least one RF test signal. The controller is also configured to determine an effective gain value based on the predefined characteristic. The controller is also configured to cause the receive circuit to convert the at least one RF test signal into a digital test signal based on the effective gain value and communicate the digital test signal to the server apparatus via the communication interface. The controller is also configured to communicate a gain descriptor comprising the effective gain value to the server apparatus via the communication interface. The controller is also configured to receive a common gain value via the communication interface. The controller is also configured to cause the receive circuit to convert the at least one RF test signal into the digital test signal based on the common gain value.

In another aspect, a server apparatus in a distributed RAN is provided. The server apparatus includes a server communication interface coupled to a plurality of wireless transceiver nodes via a communication medium. The server apparatus also includes a control circuit communicatively coupled to the server communication interface. The control circuit is configured to operate in a maintenance mode to receive one or more digital test signals in association with one or more gain descriptors from one or more selected wireless transceiver nodes among the plurality of wireless transceiver nodes via the server communication interface. The control circuit is also configured to operate in a maintenance mode to determine a common gain value for the one or more selected wireless transceiver nodes based on the one or more gain descriptors. The control circuit is also configured to operate in a maintenance mode to communicate the common gain value to the one or more selected wireless transceiver nodes via the server communication interface.

In another aspect, a distributed RAN is provided. The distributed RAN includes a communication medium. The distributed RAN also includes a server apparatus. The server apparatus includes a server communication interface coupled to the communication medium. The server apparatus also includes a control circuit communicatively coupled to the server communication interface. The distributed RAN also includes a plurality of wireless transceiver nodes coupled to the server apparatus via the communication medium. Each of the plurality of wireless transceiver nodes includes a communication interface coupled to the communication medium, a receive circuit coupled to the communication interface, and a controller communicatively coupled to the communication interface and the receive circuit. In a maintenance mode, one or more selected receive circuits in one or more selected wireless transceiver nodes among the plurality of wireless transceiver nodes are each configured to receive at least one RF test signal in a selected receive band. In the maintenance mode, one or more controllers in the one or more selected wireless transceiver nodes are each configured to determine a predefined characteristic of the at least one RF test signal, determine an effective gain value based on the predefined characteristic, cause the receive circuit to convert the at least one RF test signal into a digital test signal based on the effective gain value and communicate the digital test signal to the server apparatus via the communication interface, and communicate a gain descriptor comprising the effective gain value to the server apparatus via the communication interface. In the maintenance mode, the control circuit in the server apparatus is configured to receive one or more digital test signals in association with one or more gain descriptors from the one or more selected wireless transceiver nodes among the plurality of wireless transceiver nodes via the server communication interface. In the maintenance mode, the control circuit in the server apparatus is also configured to determine a common gain value for the one or more selected wireless transceiver nodes based on the one or more gain descriptors, and communicate the common gain value to the one or more selected wireless transceiver nodes via the server communication interface. In the maintenance mode, the one or more controllers in the one or more selected wireless transceiver nodes are also each further configured to receive the common gain value via the communication interface, and cause the receive circuit to convert the at least one RF test signal into the digital test signal based on the common gain value.

In another aspect, a method for supporting coordinated amplifier gain optimization in a distributed RAN is provided. The method includes causing one or more selected wireless transceiver nodes in the distributed RAN to each receive at least one RF test signal. The method also includes determining a predefined characteristic of the at least one RF test signal in each of the one or more selected wireless transceiver nodes. The method also includes determining an effective gain value based on the predefined characteristic in each of the one or more selected wireless transceiver nodes. The method also includes converting the at least one RF test signal into a digital test signal based on the effective gain value in each of the one or more selected wireless transceiver nodes. The method also includes determining a common gain value for each of the one or more selected wireless transceiver nodes. The method also includes communicating the common gain value to each of the one or more selected wireless transceiver nodes.

Additional features and advantages will be set forth in the detailed description which follows and, in part, will be readily apparent to those skilled in the art from the description or recognized by practicing the embodiments as described in the written description and claims hereof, as well as the appended drawings.

It is to be understood that both the foregoing general description and the following detailed description are merely exemplary and are intended to provide an overview or framework to understand the nature and character of the claims.

The accompanying drawings are included to provide a further understanding of the disclosure, and are incorporated in and constitute a part of this specification. The drawings illustrate one or more embodiment(s), and together with the description serve to explain principles and operation of the various embodiments.

DETAILED DESCRIPTION

Figure 1:
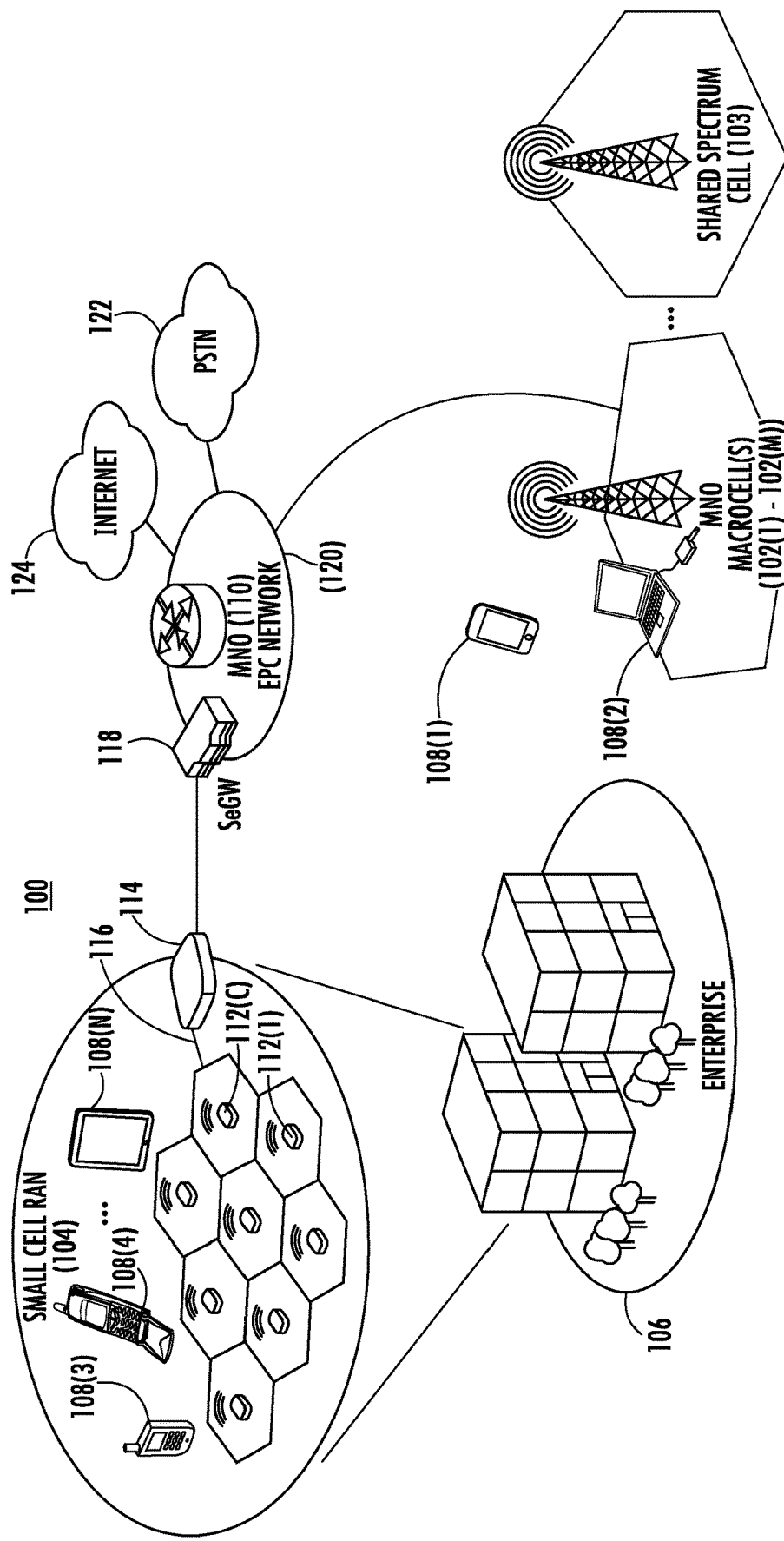
FIG. 1 is a schematic diagram of an exemplary mobile telecommunications environment that includes an exemplary macrocell radio access network (RAN) and an exemplary small cell RAN located within an enterprise environment and configured to service mobile communications between a user mobile communications device to a mobile network operator (MNO)

Embodiments of the disclosure relate to a distributed radio access network (RAN) supporting coordinated amplifier gain optimization. The distributed RAN includes a server apparatus and a number of wireless transceiver nodes (e.g., small cell radio nodes) coupled to the server apparatus via a communication medium (e.g., an optical fiber-based communication medium). The distributed RAN is configured to form a number of coverage cells, each consisting of a wireless transceiver node(s), such as a low-power radio(s) (LPR(s)). The wireless transceiver node(s) in a coverage cell is configured to receive and convert an uplink radio frequency (RF) communications signal(s) into an uplink digital communications signal(s) for communication to the server apparatus over the communication medium. In this regard, the wireless transceiver node(s) includes an analog-to-digital converter(s) (ADC(s)) for converting the uplink RF communications signal(s) into the uplink digital communications signal(s). Notably, the ADC(s) typically operates in a defined dynamic range, which defines minimum and maximum power amplitude of the uplink RF communications signal(s) that the ADC(s) can process without causing distortion (e.g., amplitude clipping) in the uplink digital communications signal(s). As such, the wireless transceiver node(s) may employ a variable gain amplifier(s) (VGA(s)) to adjust the power amplitude of the uplink RF communications signal(s) to the defined dynamic range of the ADC(s) prior to converting the uplink RF communications signal(s) into the uplink digital communications signal(s). In this regard, the VGA(s) can be set to an effective gain level(s) so determined to adjust the power amplitude of the uplink RF communications signal(s) to the defined dynamic range of the ADC(s). As a result, it may be possible to prevent the uplink digital communications signal(s) from being distorted by the ADC(s) regardless of actual power amplitude of the uplink RF communications signal(s).

In examples discussed herein, the server apparatus is configured to determine a common gain value for the VGA(s) in the wireless transceiver node(s) located in the coverage cell to prevent the ADC(s) in the wireless transceiver node(s) from distorting the uplink digital communications signal(s). In this regard, a selected wireless transceiver node(s) in a selected coverage cell is configured to receive an RF test signal(s) from a second selected wireless transceiver node(s) in a second selected coverage cell (e.g., a neighboring coverage cell). The selected wireless transceiver node(s) determines a predefined characteristic of the RF test signal(s). Accordingly, the selected wireless transceiver node(s) determines an effective gain value that falls within an effective gain range(s) of the VGA(s) based on the predefined characteristic of the RF test signal(s). The selected wireless transceiver node(s) communicates the effective gain value, together with other related parameters, such as the effective gain range(s), to the server apparatus. The server apparatus is configured to determine a common gain value for the selected wireless transceiver node(s) located in the selected coverage cell based on the parameters reported by the selected wireless transceiver node(s) and communicate the common gain value to the selected wireless transceiver node(s) in the selected coverage cell. Accordingly, the selected wireless transceiver node(s) in the selected coverage cell configures the VGA(s) to operate based on the common gain value determined by the server apparatus. By determining a respective common gain value for each of the coverage cells in the distributed RAN, it may be possible for all the wireless transceiver nodes in the distributed RAN to communicate the uplink digital communications signal(s) without causing distortion in the uplink digital communications signal(s), thus helping to improve performance and user experience in the distributed RAN.

Figure 2:
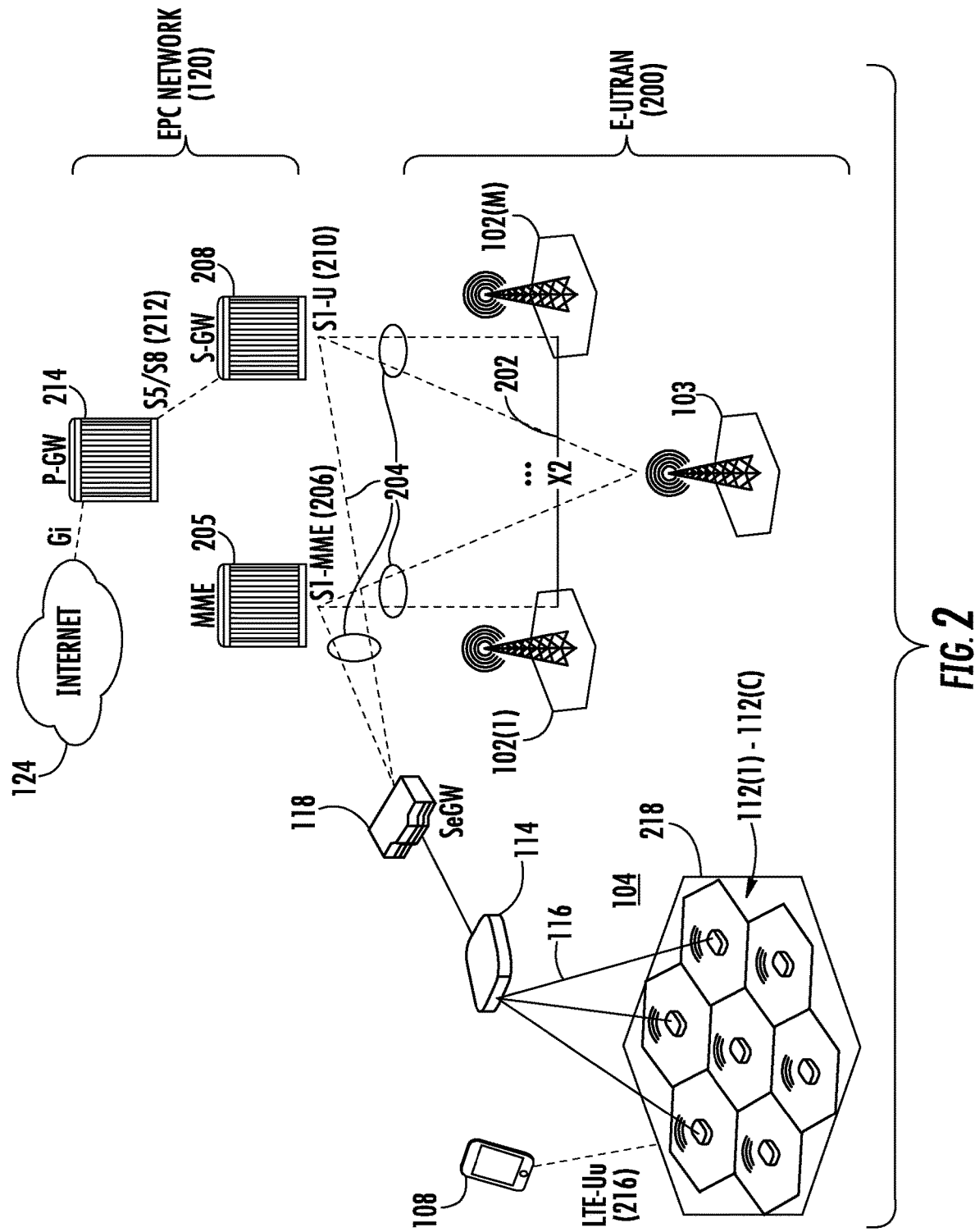
FIG. 2 illustrates exemplary details of an evolved packet core (EPC) and Evolved Universal Mobile Telecommunications System (UMTS) Terrestrial Radio Access Network (E-UTRAN) arranged under LTE (Long Term Evolution) for the mobile telecommunications environment in FIG. 1.

FIG. 2 illustrates exemplary details of an evolved packet core (EPC) and Evolved Universal Mobile Telecommunications System (UMTS) Terrestrial Radio Access Network (E-UTRAN) arranged under LTE (Long Term Evolution) for the mobile telecommunications environment in FIG. 1. Common elements between FIGS. 1 and 2 are shown therein with common element numbers and will not be re-described herein.

Along with macrocells 102(1)-102(M), the small cell RAN 104 forms an access network (i.e., an E-UTRAN) under 3GPP as represented by reference numeral 200 in FIG. 2. As shown in FIG. 2, there is no centralized controller in the E-UTRAN 200, hence an LTE network architecture is commonly said to be "flat." Macrocells 102(1)-102(M) are typically interconnected using an X2 interface 202. The shared spectrum cell 103 may or may not be interconnected to the macrocells 102(1)-102(M) through the X2 interface 202. The macrocells 102(1)-102(M) and the shared spectrum cell 103 are also typically connected to the EPC network 120 by means of an S1 interface 204. More particularly, the macrocells 102(1)-102(M) and the shared spectrum cell 103 are connected to a Mobility Management Entity (MME) 205 in the EPC network 120 using an S1-MME interface 206, and to a Serving Gateway (S-GW) 208 using an S1-U interface 210. An S5/S8 interface 212 couples the S-GW 208 to a Packet Data Network Gateway (P-GW) 214 in the EPC network 120 to provide the user mobile communications device 108 with connectivity to the Internet 124. A user mobile communications device 108 can connect to the wireless transceiver nodes 112(1)-112(C) in the small cell RAN 104 over an LTE-Uu interface 216.

The S1-MME interface 206 is also connected to the MME 205 and S-GW 208 in the EPC network 120 using the appropriate S1 interface 204 connections. Accordingly, as each of the wireless transceiver nodes 112(1)-112(C) in the small cell RAN 104 is operatively coupled to the services node 114 over the LAN connection 116, the communications connections from the wireless transceiver nodes 112(1)-112 (C) are aggregated to the EPC network 120. Such aggregation preserves the flat characteristics of the LTE network while reducing the number of S1 interface 204 connections that would otherwise be presented to the EPC network 120. Thus, the small cell RAN 104 essentially appears as a single eNB 218 to the EPC network 120, as shown.

The small cell RAN 104 can be reconfigured according to an embodiment of the present disclosure to form a distributed RAN to support coordinated amplifier gain optimization. In this regard, FIG. 3 is a schematic diagram of an exemplary distributed RAN 300 configured according to an embodiment of the present disclosure to support coordinated amplifier gain optimization.

The distributed RAN 300 includes a server apparatus 302. In an operation mode, in which the distributed RAN 300 is configured to provide normal communications services in a plurality of coverage cells 306(1)-306(M), the server apparatus 302 is configured to communicate a plurality of downlink digital communications signals 304D(1)-304D (M) and a plurality of uplink digital communications signals 304U(1)-304U(M) with the coverage cells 306(1)-306(M) over a communication medium 308. Each of the coverage cells 306(1)-306(M) includes one or more wireless transceiver nodes 310(1)-310(N) (denoted as "LPR" in FIG. 3), wherein N may be the same or different between the coverage cells 306(1)-306(M). The wireless transceiver nodes 310(1)-310(N) in the coverage cells 306(1)-306(M) are configured to receive and convert the downlink digital communications signals 304D(1)-304D(M) into a plurality of downlink RF communications signals 312D(1)-312D(M) for distribution in the coverage cells 306(1)-306(M). The wireless transceiver nodes 310(1)-310(N) in the coverage cells 306(1)-306(M) are also configured to receive a plurality of uplink RF communications signals 312U(1)-312U(M) in the coverage cells 306(1)-306(M) and convert the uplink RF communications signals 312U(1)-312U(M) into the uplink digital communications signals 304U(1)-304U(M) for communication to the server apparatus 302.

To help understand operations in the wireless transceiver nodes 310(1)-310(N), an exemplary wireless transceiver node is now discussed. In this regard, FIG. 4 is a schematic diagram of an exemplary wireless transceiver node 400, which can be provided in the distributed RAN 300 of FIG. 3 as any of the wireless transceiver nodes 310(1)-310(N) in any of the coverage cells 306(1)-306(M). Common elements between FIGS. 3 and 4 are shown therein with common element numbers and will not be re-described herein.

Figure 3:
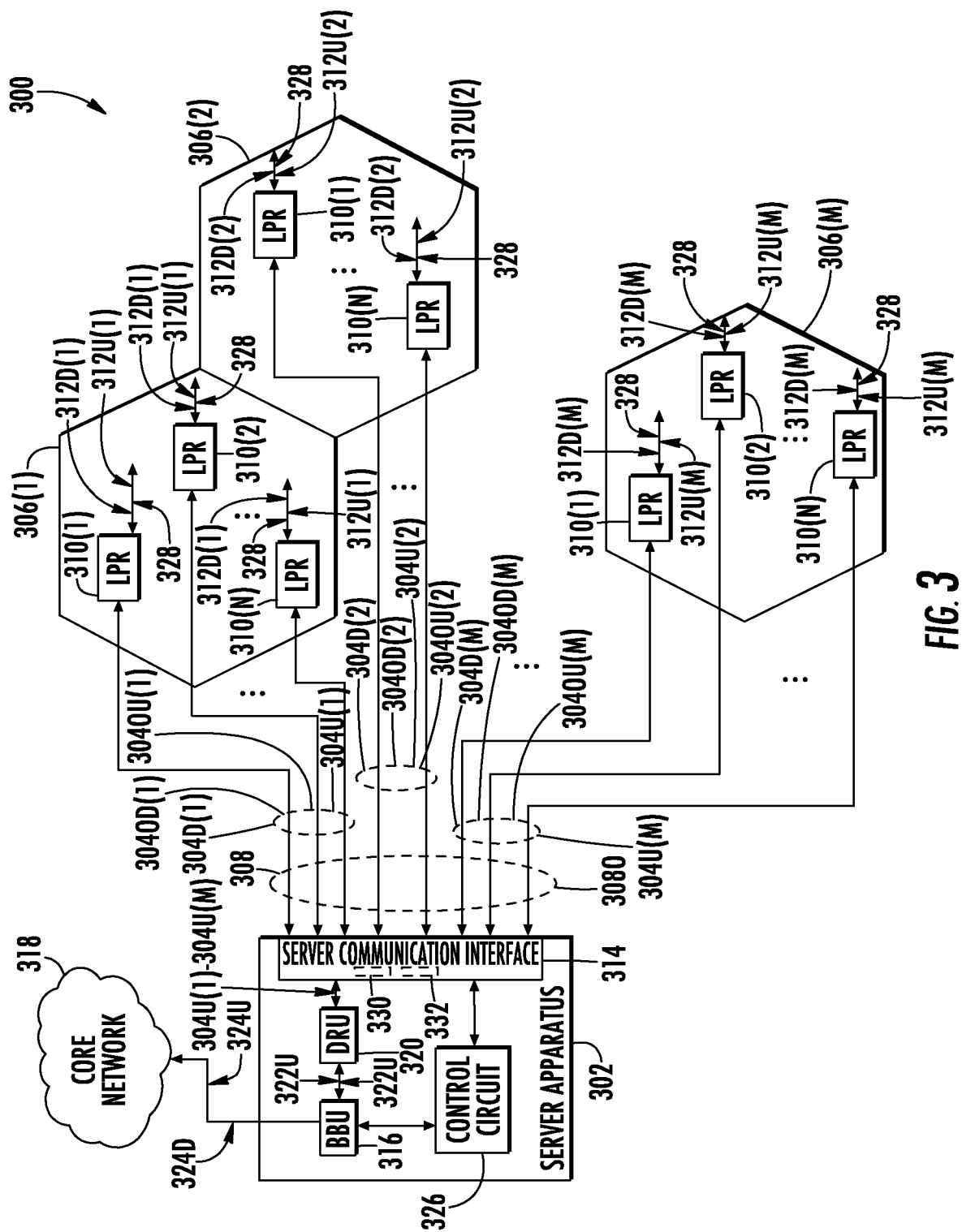
FIG. 3 is a schematic diagram of an exemplary distributed RAN configured according to an embodiment of the present disclosure to support coordinated amplifier gain optimization.
Figure 4:
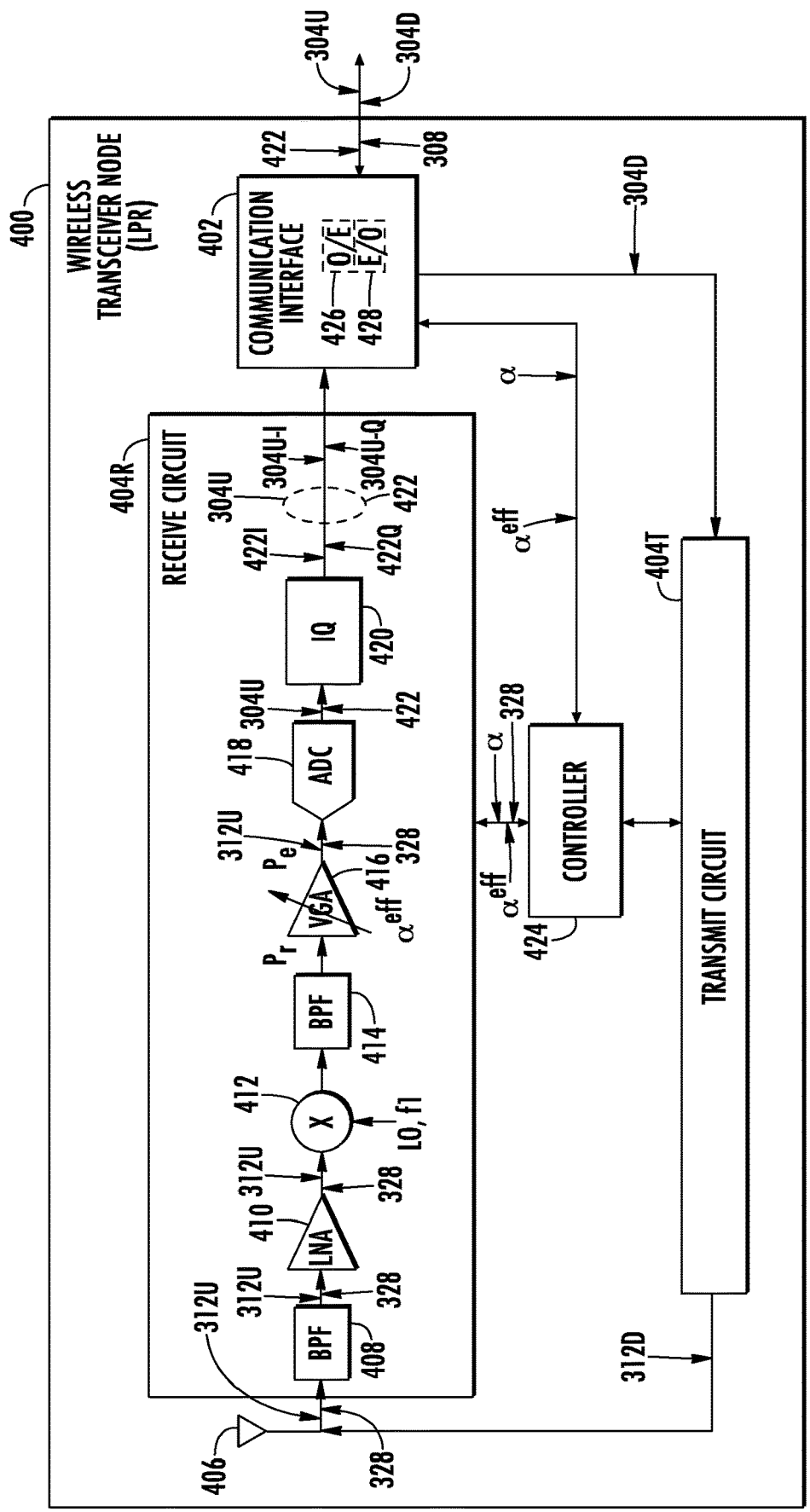
FIG. 4 is a schematic diagram of an exemplary wireless transceiver node, which can be provided as any wireless transceiver node located in any coverage cell in the distributed RAN of FIG. 3.

The wireless transceiver node 400 includes a communication interface 402 coupled to the communication medium 308 to receive a downlink digital communications signal 304D, which can be any of the downlink digital communications signals 304D(1)-304D(M) in FIG. 3, and communicate an uplink digital communications signal 304U, which can be any of the uplink digital communications signal 304U(1)-304U(M) in FIG. 3. The wireless transceiver node 400 includes a receive circuit 404R coupled between the communication interface 402 and an antenna(s) 406. The receive circuit 404R is configured to receive an uplink RF communications signal 312U, which can be any of the uplink RF communications signals 312U(1)-312U(M) in FIG. 3, via the antenna(s) 406. The wireless transceiver node 400 also includes a transmit circuit 404T coupled between the communication interface 402 and the antenna(s) 406. The transmit circuit 404T is configured to receive and convert the downlink digital communications signal 304D into a downlink RF communications signal 312D, which can be any of the downlink RF communications signals 312D (1)-312D(M) in FIG. 3, for distribution via the antenna(s) 406.

The receive circuit 404R includes a bandpass filter 408 (denoted as "BPF") configured to pass the uplink RF communications signal 312U in a selected receive band, while rejecting the uplink RF communications signal 312U outside the selected receive band. The receive circuit 404R includes a low-noise amplifier (LNA) 410 configured to amplify the uplink RF communications signal 312U to a receive power $P_r$. The receive circuit 404R includes a frequency converter 412 configured to convert the uplink RF communications signal 312U from the selected receive band to a selected intermediate frequency (IF) band based on a local oscillation (LO) frequency $f_1$. The receive circuit 404R includes a second bandpass filter 414 (denoted as "BPF") configured to pass the uplink RF communications signal 312U in the selected IF band, while rejecting the uplink RF communications signal 312U outside the selected IF band. The receive circuit 404R includes a variable gain amplifier (VGA) 416 configured to adjust the uplink RF communications signal 312U from the receive power $P_r$ to an effective power $P_e$. The receive circuit 404R includes an analog-to-digital converter (ADC) 418 configured to convert the uplink RF communications signal 312U into the uplink digital communications signal 304U. The receive circuit 404R may include an in-phase (I)/quadrature (Q) (I/Q) demodulator 420 (denoted as "IQ") configured to demodulate the uplink digital communications signal 304U into an uplink digital in-phase communications signal 304U-I and an uplink digital quadrature communications signal 403U-Q.

Notably, the ADC 418 is configured to convert the uplink RF communications signal 312U into the uplink digital communications signal 304U by sampling and digitizing time-variant power amplitudes of the uplink RF communications signal 312U at a predefined sampling rate. The ADC 418 may include a binary register(s) for storing digitized power amplitudes of the uplink RF communications signal 312U. Given that the binary register(s) can only store a limited number of binary bits, the ADC 418 is only capable of converting the uplink RF communications signal 312U up to a maximum level of the effective power $P_e$ without causing amplitude clipping in the uplink digital communications signal 304U. In this regard, the ADC 418 imposes an upper power amplitude boundary on the uplink RF communications signal 312U.

Understandably, the receive circuit 404R can create inherent noises that may cause an elevated noise floor. In this regard, for the ADC 418 to be able to sample and convert the uplink RF communications signal 312U, the effective power $P_e$ of the uplink RF communications signal 312U must be above the noise floor of the receive circuit 404R. In this regard, the ADC 418 imposes a lower power amplitude boundary on the uplink RF communications signal 312U. Collectively, the upper power amplitude boundary and the lower power amplitude boundary define a dynamic range in decibel (dB) of the ADC 418.

The uplink RF communications signal 312U may correspond to a large peak-to-average ratio (PAR), especially when the uplink RF communications signal 312U is modulated with a higher modulation bandwidth (e.g., >50 MHz) in such RAN as E-UTRAN. As such, it may be necessary to adjust the effective power $P_e$ of the uplink RF communications signal 312U to within the dynamic range of the ADC 418 prior to converting the uplink RF communications signal 312U to the uplink digital communications signal 304U, regardless of the receive power $P_r$ of the uplink RF communications signal 312U.

In this regard, the VGA 416 is configured to adjust the uplink RF communications signal 312U to the effective power $P_e$ that falls within the dynamic range of the ADC 418, regardless of the receive power $P_r$ of the uplink RF communications signal 312U. Notably, the VGA 416 is configured to adjust the uplink RF communications signal 312U from the receive power $P_r$ to the effective power $P_e$ based on an effective gain value $\alpha^{eff}$ ($P_e = \alpha^{eff} \times P_r$). In this regard, it may be desired to configure the VGA 416 to operate based on the effective gain value $\alpha^{eff}$ at an appropriate value that falls within an effective gain range [$\alpha^{eff}_{min}$, $\alpha^{eff}_{max}$] of the VGA 416 and to ensure that the effective power $P_e$ of the uplink RF communications signal 312U falls within the dynamic range of the ADC 418.

With reference back to FIG. 3, the server apparatus 302 includes a server communication interface 314 coupled to the wireless transceiver nodes 310(1)-310(N) in each of the coverage cells 306(1)-306(M) via the communication medium 308. The server apparatus 302 includes a baseband unit (BBU) 316, which is communicatively coupled to a core network (e.g., EPC or E-UTRAN) 318. The BBU 316 may be configured to function as a services node, such as the services node 114 in FIG. 2, for the distributed RAN 300. The server apparatus 302 further includes a digital routing unit (DRU) 320 communicatively coupled to the server communication interface 314 and the BBU 316. Hereinafter, a first entity and a second entity are communicatively coupled to each other when a direct or an indirect connection exists between the first entity and the second entity. The DRU 320 is configured to receive the uplink digital communications signals 304U(1)-304U(M) via the server communication interface 314 and generate an uplink composite digital communications signal 322U consisting of the uplink digital communications signals 304U(1)-304U(M). The BBU 316 is configured to generate an uplink digital baseband communications signal 324U based on the uplink composite digital communications signal 322U and communicate the uplink digital baseband communications signal 324U to the core network 318. In a non-limiting example, the uplink digital baseband communications signal 324U can be encoded based on such digital baseband communication standards as common public radio interface (CPRI).

The BBU 316 is configured to receive a downlink digital baseband communications signal 324D, which may also be encoded based on the CPRI standard, from the core network 318. The BBU 316 is configured to generate and provide a downlink composite digital communications signal 322D to the DRU 320. The DRU 320 is configured to convert the downlink composite digital communications signal 322D into the downlink digital communications signals 304D(1)-304D(M) for distribution via the server communication interface 314.

The server apparatus 302 includes a control circuit 326, which can be a microprocessor, a microcontroller, or a field-programmable gate array (FPGA), for example. The control circuit 326 may be provided as a standalone control circuit or integrated with the BBU 316. The control circuit 326 may be communicatively coupled to the server communication interface 314 and/or the BBU 316. In a non-limiting example, the distributed RAN 300 may be configured to operate as a self-optimizing network (SON) in accordance to a new RAN architecture as defined by 3 GPP. In this regard, the control circuit 326 may function as a brain of the distributed RAN 300 to optimize the wireless transceiver nodes 310(1)-310(N) in each of the coverage cells 306(1)-306(M), including but not limited to determining the desirable effective gain value $\alpha^{eff}$ for each of the wireless transceiver nodes 310(1)-310(N).

As previously discussed in FIG. 4, the effective gain value $\alpha^{eff}$ is so determined for the VGA 416 to cause the effective power $P_e$ of the uplink RF communications signal 312U to fall within the dynamic range of the ADC 418. In this regard, for the control circuit 326 to determine the effective gain value $\alpha^{eff}$ for any of the wireless transceiver nodes 310(1)-310(N) in any of the coverage cells 306(1)-306(M), the control circuit 326 needs to know the dynamic range of the ADC 418, the effective power $P_e$ of the uplink RF communications signal 312U, and the effective gain range $[\alpha^{eff}_{min}, \alpha^{eff}_{max}]$ of the VGA 416 of the wireless transceiver node.

Given that the dynamic range of the ADC 418 and the effective gain range $[\alpha^{eff}_{min}, \alpha^{eff}_{max}]$ of the VGA 416 can be static and pre-configured, it may be possible to pre-store these parameters in the server apparatus 302. In contrast, the effective power $P_e$ of the uplink RF communications signal 312U is time-variant. As such, the control circuit 326 needs to determine the effective power $P_e$ of the uplink RF communications signal 312U as outputted by the VGA 416.

If the control circuit 326 is able to receive the uplink digital in-phase communications signal 304U-I and the uplink digital quadrature communications signal 403U-Q directly from each of the wireless transceiver nodes 310(1)-310(N) in each of the coverage cells 306(1)-306(M), the control circuit 326 may estimate the effective power $P_e$ of the uplink RF communications signal 312U based on in-phase power amplitude I of the uplink digital in-phase communications signal 304U-I and quadrature power amplitude Q of the uplink digital quadrature communications signal 304U-Q ($P_r = I^2 + Q^2$). However, since the DRU 320 combines all of the uplink digital communications signals 304U(1)-304U(M) into the uplink composite digital communications signal 322U, it may become difficult for the control circuit 326 to determine the effective power $P_e$ for each of the wireless transceiver nodes 310(1)-310(N) in each of the coverage cells 306(1)-306(M) based on the uplink composite digital communications signal 322U.

In this regard, according to embodiments discussed below, the distributed RAN 300 can be configured to support coordinated amplifier gain optimization without changing existing topology and/or affecting normal operation of the distributed RAN 300. According to an embodiment of the present disclosure, the control circuit 326 can be configured to estimate a number of common gain values a1-am for the coverage cells 306(1)-306(M), respectively. In this regard, a respective VGA 416 in each of the wireless transceiver nodes 310(1)-310(N) located in a given coverage cell is configured to have the same common gain value. For example, the respective VGA 416 in each of the wireless transceiver nodes 310(1)-310(N) in the coverage cell 306(1) will be operating based on the common gain value $\alpha$. Accordingly, the control circuit 326 determines the common gain value $\alpha$ to ensure that the respective VGA 416 in each of the wireless transceiver nodes 310(1)-310(N) in the coverage cell 306(1) can adjust the uplink RF communications signal 312U(1) to a respective effective power $P_e$ that falls with a respective dynamic range of the respective ADC 418.

The control circuit 326 can be configured to determine the common gain values $\alpha_1$-$\alpha_M$ for the coverage cells 306(1)-306(M) by switching the distributed RAN 300 to a maintenance mode, in which the distributed RAN 300 is taken offline from normal communication service to carry out calibration, testing, and/or maintenance tasks. In a non-limiting example, the distributed RAN 300 can be configured to operate in the maintenance mode after initial deployment and/or during off-peak hours (e.g., nights or weekends).

After switching the distributed RAN 300 to the maintenance mode, the control circuit 326 can be configured to cause the wireless transceiver nodes 310(1)-310(N) in one of the coverage cells 306(1)-306(M), for example the coverage cell 306(1), to transmit at least one RF test signal 328, while causing the wireless transceiver nodes 310(1)-310(N) in all other coverage cells, for example the coverage cells 306(2)-306(M), to simultaneously receive the RF test signal 328. After a predefined reception duration (e.g., 10 milliseconds), the control circuit 326 can cause the wireless transceiver nodes 310(1)-310(N) in another one of the coverage cells 306(1)-306(M), for example the coverage cell 306(2), to transmit the RF test signal 328, while causing the wireless transceiver nodes 310(1)-310(N) in all other coverage cells, for example the coverage cells 306(1) and 306(3)-306(M), to simultaneously receive the RF test signal 328. The control circuit 326 can be configured to repeat the rotation until the wireless transceiver nodes 310(1)-310(N) in each of the coverage cells 306(1)-306(M) have the chance to transmit the RF test signal 328.

Upon receiving the RF test signal 328, each of the wireless transceiver nodes 310(1)-310(N) in any one of the coverage cells 306(1)-306(M) is configured to process the RF test signal 328 as described below with reference to the wireless transceiver node 400 of FIG. 4. With reference back to FIG. 4, the receive circuit 404R receives the RF test signal 328 via the antenna(s) 406. The receive circuit 404R may receive the RF test signal 328 in the selected receive band of the uplink RF communications signal 312U.

The bandpass filter 408 is configured to pass the RF test signal 328 in the selected receive band, while rejecting the RF test signal 328 outside the selected receive band. The LNA 410 is configured to amplify the RF test signal 328 to the receive power $P_r$. The frequency converter 412 is configured to convert the RF test signal 328 from the selected receive band to the selected IF band based on the LO frequency $f_1$. The second bandpass filter 414 is configured to pass the RF test signal 328 in the selected IF band, while rejecting the RF test signal 328 outside the selected IF band. The VGA 416 is configured to adjust the RF test signal 328 from the receive power $P_r$ to the effective power $P_e$. The ADC 418 is configured to convert the RF test signal 328 into a digital test signal 422. The IQ demodulator 420 is configured to demodulate the digital test signal 422 into a digital in-phase test signal 422I and a digital quadrature test signal 422Q. The receive circuit 404R is configured to communicate the digital test signal 422 to the server apparatus 302 of FIG. 3 via the communication interface 402.

The wireless transceiver node 400 includes a controller 424, which can be a microprocessor or a Field Programmable Gate Array (FPGA), for example. The controller 424 is communicatively coupled to the communication interface 402, the receive circuit 404R, and the transmit circuit 404T. The controller 424 is configured to receive the RF test signal 328 from the receive circuit 404R and process the RF test signal 328 to determine a predefined characteristic of the RF test signal 328. In a non-limiting example, the predefined characteristic of the RF test signal 328 can include such characteristics as signal-to-noise ratio (SNR), noise floor, peak-to-average ratio (PAR), and so on. Based on the predefined characteristic, the controller 424 determines the effective gain value $\alpha^{e\!f\!f}$ that falls with the effective gain range $[\alpha^{e\!f\!f}_{min}, \alpha^{e\!f\!f}_{max}]$ of the VGA 416. Accordingly, the VGA 416 adjusts the RF test signal 328 from the receive power $P_r$ to the effective power $P_e$ that falls within the dynamic range of the ADC 418.

The controller 424 is configured to generate a gain descriptor and communicate the gain descriptor to the server apparatus 302 of FIG. 3 via the communication interface 402. In a non-limiting example, the gain descriptor includes the effective gain value $\alpha^{e\!f\!f}$ as well as the effective gain range $[\alpha^{e\!f\!f}_{min}, \alpha^{e\!f\!f}_{max}]$ of the VGA 416.

With reference back to FIG. 3, during the predefined reception duration, the server apparatus 302 receives a respective gain descriptor from each of the wireless transceiver nodes 310(1)-310(N) in any of the coverage cells 306(1)-306(M), except for the coverage cell configured to transmit the RF test signal 328. In this regard, the server apparatus 302 may receive N gain descriptors from the wireless transceiver nodes 310(1)-310(N) in any selected coverage cell, for example the coverage cell 306(1), among the coverage cells 306(1)-306(M). Notably, the N gain descriptors can include N effective gain values $\alpha_i^{e\!f\!f}$ and N effective gain ranges $[\alpha^{e\!f\!f}_{min}, \alpha^{e\!f\!f}_{max}]_i$ ($1 \leq i \leq N$) that correspond to the wireless transceiver nodes 310(1)-310(N), respectively. Accordingly, the control circuit 326 can determine the common gain value $\alpha$ for the VGA 416 in each of the wireless transceiver nodes 310(1)-310(N) in the selected coverage cell based on the N gain descriptors.

In one non-limiting example, the control circuit 326 can determine the common gain value $\alpha$ based on a least square algorithm with an inequality constraint, as expressed in equation below.

$$\text{minimize} \sum_{i=1}^{N} \text{abs}(\alpha - \alpha_i^{e\!f\!f})^2$$

In the above equation, the inequality constraint is defined by a largest minimum effective gain value $\alpha^{e\!f\!f}$ min-max among minimum effective gain values $[\alpha^{e\!f\!f}_{min}]_i$ ($1 \leq i \leq N$) and a smallest maximum effective gain value $\alpha^{e\!f\!f}_{max-min}$ among maximum effective gain values $[\alpha^{e\!f\!f}_{max}]_i$ ($1 \leq i \leq N$) in the N effective gain ranges $[\alpha^{e\!f\!f}_{min}, \alpha^{e\!f\!f}_{max}]_i$ ($1 \leq i \leq N$). In this regard, to satisfy the inequality constraint $[\alpha^{e\!f\!f}_{min-max}, \alpha^{e\!f\!f}_{max-min}]$, the common gain value $\alpha$ needs to be greater than or equal to the largest minimum effective gain value $\alpha^{e\!f\!f}_{min-max}$ and less than or equal to the smallest maximum effective gain value $\alpha^{e\!f\!f}_{max-min}$. Based on the equation above with the inequality constraint, the common gain value $\alpha$ can be determined based on the equation below.

$$\alpha = \left[\frac{1}{N}\sum_{i=1}^{N} \alpha_i^{e\!f\!f}\right]_{[\alpha^{e\!f\!f} \min - \max, \, \alpha^{e\!f\!f} \max - \min]}$$

In another non-limiting example, the control circuit 326 can determine the common gain value $\alpha$ based on a mean absolute deviation algorithm, as expressed in equation below.

$$\text{minimize} \sum_{i=1}^{N} \text{abs}(\alpha - \alpha_i^{e\!f\!f})$$

Accordingly, the common gain value $\alpha$ can be determined based on the equation below.

$$\alpha = [\text{median}\{\alpha_i^{e\!f\!f}\}]_{[\alpha^{e\!f\!f}_{min-max}, \alpha^{e\!f\!f}_{max-min}]} \, (1 \leq i \leq N)$$

To satisfy the inequality constraint $[\alpha^{e\!f\!f}_{min-max}, \alpha^{e\!f\!f}_{max-min}]$, the common gain value $\alpha$ needs to be greater than or equal to the largest minimum effective gain value $\alpha^{e\!f\!f}_{min-max}$ and less than or equal to the smallest maximum effective gain value $\alpha^{e\!f\!f}_{max-min}$.

In another non-limiting example, the control circuit 326 can determine the common gain value $\alpha$ based on a weighted least square algorithm, as expressed in the equation below.

$$\text{minimize} \sum_{i=1}^{N} w_i * \text{abs}(\alpha - \alpha_i^{e\!f\!f})^2$$

In the equation above, $w_i$ ($1 \leq i \leq N$) represents a respective fractional weight factor ($0 < w_i < 1$) assigned to the wireless transceiver nodes 310(1)-310(N), respectively. The fractional weight factor $w_i$ may be assigned to the wireless transceiver nodes 310(1)-310(N) based on such factors as installation location, surrounding environment, coverage cell size, user density, throughput requirement, and so on.

Upon determining the common gain value $\alpha$, the control circuit 326 communicates the common gain value $\alpha$ to the wireless transceiver nodes 310(1)-310(N) in the selected coverage cell via the server communication interface 314. In a non-limiting example, the control circuit 326 can communicate the common gain value $\alpha$ to the wireless transceiver nodes 310(1)-310(N) via a dedicated management/control link or a shared data link in the communication medium 308.

With reference back to FIG. 4, the controller 424 receives the common gain value $\alpha$ via the communication interface 402 and applies the common gain value $\alpha$ to the VGA 416. In this regard, when the distributed RAN 300 of FIG. 3 remains in the maintenance mode, the VGA 416 will adjust the RF test signal 328 from the receive power $P_r$ to the effective power $P_e$ based on the common gain value $\alpha$. When the distributed RAN 300 is switched back to the operation mode, the VGA 416 will adjust the uplink RF communications signal 312U from the receive power $P_r$ to the effective power $P_e$ based on the common gain value $\alpha$.

With reference back to FIG. 3 once again, in a non-limiting example, during the predefined reception duration, the wireless transceiver nodes 310(1)-310(N) in a first selected coverage cell, for example the coverage cell 306(1), are transmitting the RF test signal 328, while the wireless transceiver nodes 310(1)-310(N) in a second selected coverage cell, for example the coverage cell 306(2), are receiving simultaneously the RF test signal 328. In this regard, each of the wireless transceiver nodes 310(1)-310(N) in the second selected coverage cell 306(2) receives concurrently the RF test signal 328 transmitted from all of the wireless transceiver nodes 310(1)-310(N) in the first selected coverage cell 306(1). In this regard, the RF test signal 328 received by each of the wireless transceiver nodes 310(1)-310(N) in the second selected coverage cell 306(2) corresponds to a total power of the RF test signal 328 transmitted by all of the wireless transceiver nodes 310(1)-310(N) in the first selected coverage cell 306(1). Accordingly, the control circuit 326 can estimate the total power received by each of the wireless transceiver nodes 310(1)-310(N) in the second selected coverage cell 306(2) from all of the wireless transceiver nodes 310(1)-310(N) in the first selected coverage cell 306(1) based on the digital in-phase test signal 422I and the digital quadrature test signal 422Q, as illustrated in FIG. 4, received from each of the wireless transceiver nodes 310(1)-310(N) in the second selected coverage cell 306(2).

By being able to estimate the total power received by each of the wireless transceiver nodes 310(1)-310(N) in the second selected coverage cell 306(2) from all of the wireless transceiver nodes 310(1)-310(N) in the first selected coverage cell 306(1), the control circuit 326 can help populate a neighbor relation table (NRT) in all of the wireless transceiver nodes 310(1)-310(N) in the first selected coverage cell 306(1). In a non-limiting example, the NRT can include a predefined transmit power with respect to the second selected coverage cell 306(2). Accordingly, each of the wireless transceiver nodes 310(1)-310(N) in the first selected coverage cell 306(1) can retrieve the predefined transmit power from the NRT when transmitting the downlink RF communications signal 312D, as illustrated in FIG. 4, based on the predefined transmit power when the distributed RAN 300 is switched back to the operation mode.

Figure 5:
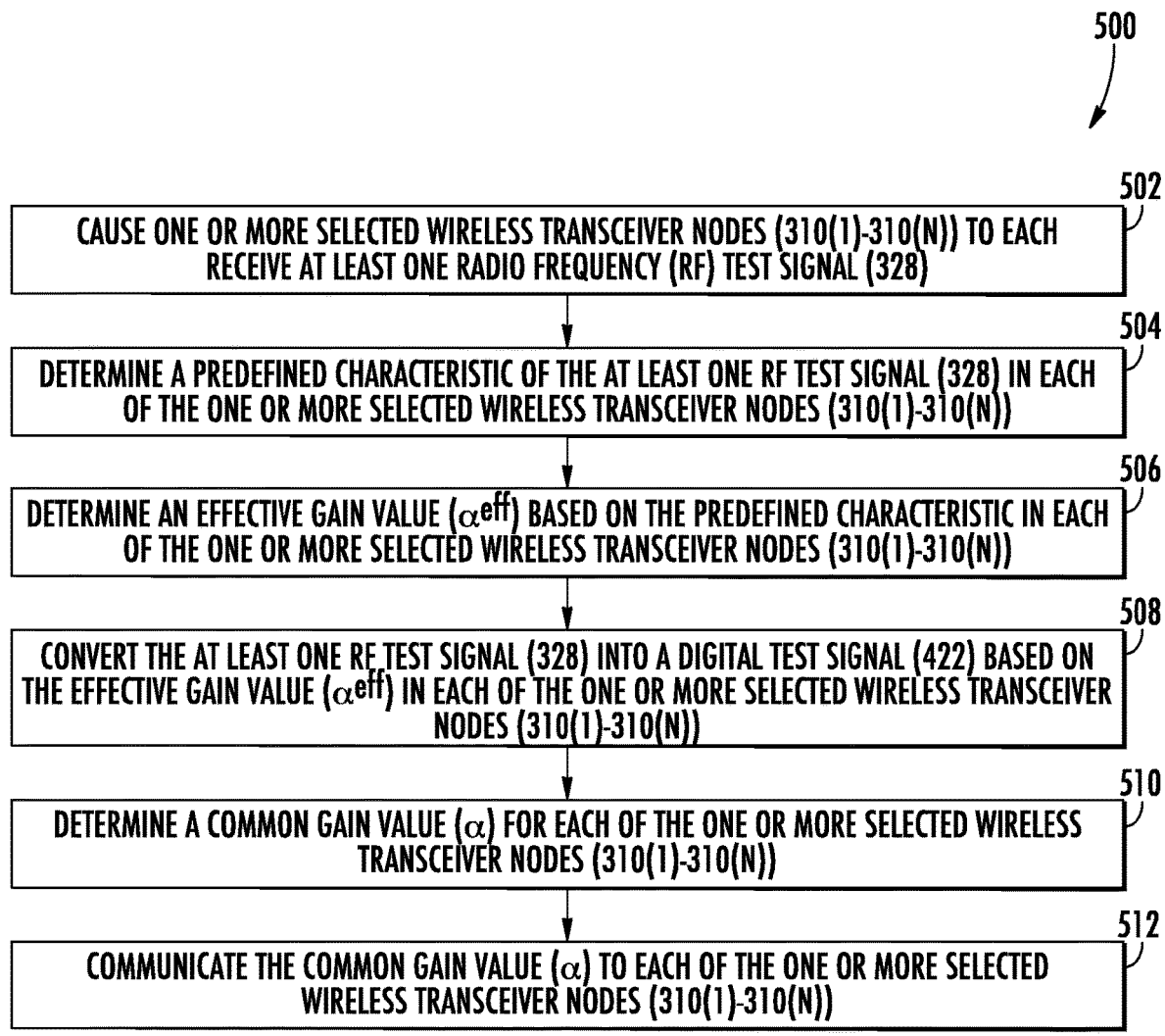
FIG. 5 is a flowchart of an exemplary process than can be employed to support coordinated amplifier gain optimization in the distributed RAN of FIG. 3.

The distributed RAN 300 may be configured to support coordinated amplifier gain optimization based on a process. In this regard, FIG. 5 is a flowchart of an exemplary process 500 than can be employed to support coordinated amplifier gain optimization in the distributed RAN 300 of FIG. 3.

According to the process 500, the wireless transceiver nodes 310(1)-310(N) in a selected coverage cell among the coverage cells 306(1)-306(M), for example the coverage cell 306(1), are configured to each receive the RF test signal 328 transmitted by the wireless transceiver nodes 310(1)-310(N) from a second selected coverage cell among the coverage cells 306(1)-306(M), for example the coverage cell 306(2) (block 502). The controller 424 in each of the wireless transceiver nodes 310(1)-310(N) in the selected coverage cell is configured to determine the predefined characteristic of the RF test signal 328 (block 504). The controller 424 in each of the wireless transceiver nodes 310(1)-310(N) in the selected coverage cell is also configured to determine the effective gain value $\alpha^{eff}$ for the VGA 416 in each of the wireless transceiver nodes 310(1)-310(N) in the selected coverage cell based on a predefined characteristic (block 506). Accordingly, the receive circuit 404R in each of the wireless transceiver nodes 310(1)-310(N) in the selected coverage cell converts the RF test signal 328 to the digital test signal 422 based on the effective gain value $\alpha^{eff}$ (block 508). Subsequently, each of the wireless transceiver nodes 310(1)-310(N) in the selected coverage cell communicates the effective gain value $\alpha^{eff}$ to the server apparatus 302. The server apparatus 302, in turn, determines the common gain value $\alpha$ for the wireless transceiver nodes 310(1)-310(N) in the selected coverage cell (block 510). The server apparatus 302 then communicates the common gain value $\alpha$ to the wireless transceiver nodes 310(1)-310(N) in the selected coverage cell (block 512). Accordingly, each of the wireless transceiver nodes 310(1)-310(N) in the selected coverage cell can convert the RF test signal 328 to the digital test signal 422 based on the common gain value $\alpha$ in the maintenance mode. Furthermore, in the operation mode, each of the wireless transceiver nodes 310(1)-310(N) in the selected coverage cell is configured to convert the uplink RF communications signal 312U to the uplink digital communications signal 304U based on the common gain value $\alpha$.

With reference back to FIG. 3 again, in a non-limiting example, the communication medium 308 can be an optical fiber-based communication medium 308O. In this regard, the server communication interface 314 may include an electrical-to-optical (E/O) converter(s) 330 for converting the downlink digital communications signals 304D(1)-304D(M) into a plurality of downlink optical digital communications signals 304OD(1)-304OD(M) for communication to the coverage cells 306(1)-306(M) over the optical fiber-based communication medium 308O. The server communication interface 314 may also include an optical-to-electrical (O/E) converter(s) 332 for converting a plurality of uplink optical digital communications signals 304OU(1)-304OU(M) received over the optical fiber-based communication medium 308O into the uplink digital communications signals 304U(1)-304U(M).

With reference to FIG. 4, the communication interface 402 may include an O/E converter 426 for converting a respective downlink optical digital communications signal among the downlink optical digital communications signals 304OD(1)-304OD(M) into a respective downlink digital communications signal among the downlink digital communications signals 304D(1)-304D(M). The communication interface 402 may also include an E/O converter 428 for converting a respective uplink digital communications signal among the uplink digital communications signals 304U(1)-304U(M) into a respective uplink optical digital communications signal among the uplink optical digital communications signals 304OU(1)-304OU(M) to be provided to the server apparatus 302.

Figure 6:
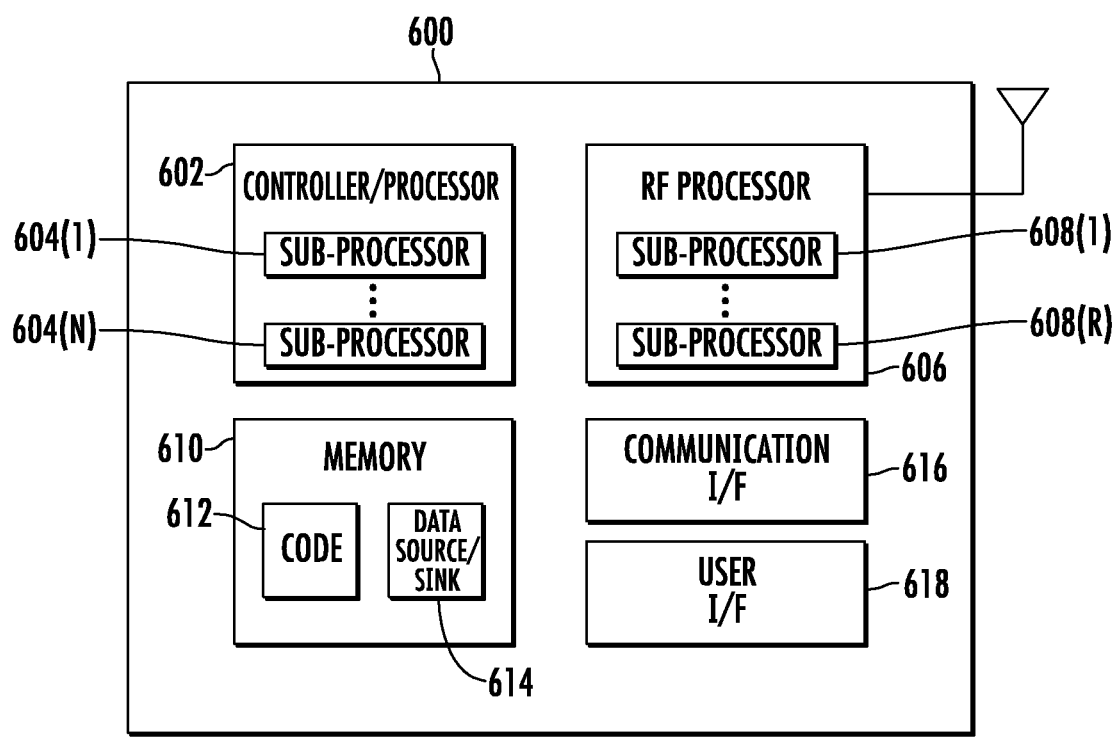
FIG. 6 is a schematic diagram of an exemplary computer system that can be implemented in a server apparatus in the distributed RAN of FIG. 3 as a control circuit or in a wireless transceiver node(s) in the distributed RAN of FIG. 3 as a controller(s) to support coordinated amplifier gain optimization in the distributed RAN of FIG. 3.

FIG. 6 is a schematic diagram of an exemplary computer system 600 that can be implemented in the server apparatus 302 in the distributed RAN of FIG. 3 as the control circuit 326 and/or in the wireless transceiver node 400 of FIG. 4 as the controller 424 to support coordinated amplifier gain optimization in the distributed RAN 300 of FIG. 3. The computer system 600 includes a controller/processor 602 that typically handles high level processing tasks. The controller/processor 602 may include one or more sub-processors 604(1)-604(N) or cores that are configured to handle specific tasks or functions. An RF processor 606 implements various signal processing functions for the downlink including the lower level L1 processing. The RF processor 606 may include one or more sub-processors 608(1)-608(R) or cores that are configured to handle specific tasks or functions. A memory 610 is a computer-readable medium that stores computer-readable code 612 that is executable by one or more processors including the controller/processor 602 and/or the RF processor 606. The memory 610 may also include various data sources and data sinks (collectively represented by element 614) that may provide additional functionalities.

The code 612 in typical deployments is arranged to be executed by the one or more processors to facilitate the discovery of a neighbor radio access system or cells reporting to a serving RAN. The code 612 additionally enables implementation of both the dedicated PCI identity and common PCI identity using the same hardware infrastructure in a given dual identity cell when executed. The hardware infrastructure may also include various interfaces (I/Fs) including a communication I/F 616 which may be used, for example, to implement a link to the server communication interface 314 (FIG. 3), the communication interface 402 (FIG. 4), LAN, or to an external processor, control, or data source. In some cases, a user I/F 618 may be utilized to provide various indications such as power status or to enable some local control of features or settings. It is noted that the block diagram 600 may also be substantially applicable to the server apparatus 302 of FIG. 3 and/or the wireless transceiver node 400 of FIG. 4. More particularly, the RF processor 606 may be eliminated in some applications and any functionality that it provides that is needed to implement the server apparatus 302 and/or the wireless transceiver node 400 may be provided by the controller/processor 602.

While the computer-readable medium is shown in an exemplary embodiment to be a single medium, the term "computer-readable medium" should be taken to include a single medium or multiple media (e.g., a centralized or distributed database, and/or associated caches and servers) that store the one or more sets of instructions. The term "computer-readable medium" shall also be taken to include any medium that is capable of storing, encoding, or carrying a set of instructions for execution by the processing device and that cause the processing device to perform any one or more of the methodologies of the embodiments disclosed herein. The term "computer-readable medium" shall accordingly be taken to include, but not be limited to, solid-state memories, optical medium, and magnetic medium.

The embodiments disclosed herein include various steps. The steps of the embodiments disclosed herein may be formed by hardware components or may be embodied in machine-executable instructions, which may be used to cause a general-purpose or special-purpose processor programmed with the instructions to perform the steps. Alternatively, the steps may be performed by a combination of hardware and software.

The embodiments disclosed herein may be provided as a computer program product, or software, that may include a machine-readable medium (or computer-readable medium) having stored thereon instructions, which may be used to program a computer system (or other electronic devices) to perform a process according to the embodiments disclosed herein. A machine-readable medium includes any mechanism for storing or transmitting information in a form readable by a machine (e.g., a computer). For example, a machine-readable medium includes: a machine-readable storage medium (e.g., ROM, random access memory ("RAM"), a magnetic disk storage medium, an optical storage medium, flash memory devices, etc.); and the like.

Unless specifically stated otherwise and as apparent from the previous discussion, it is appreciated that throughout the description, discussions utilizing terms such as "processing," "computing," "determining," "displaying," or the like, refer to the action and processes of a computer system, or similar electronic computing device, that manipulates and transforms data and memories represented as physical (electronic) quantities within the computer system's registers into other data similarly represented as physical quantities within the computer system memories or registers or other such information storage, transmission, or display devices.

The algorithms and displays presented herein are not inherently related to any particular computer or other apparatus. Various systems may be used with programs in accordance with the teachings herein, or it may prove convenient to construct more specialized apparatuses to perform the required method steps. The required structure for a variety of these systems will appear from the description above. In addition, the embodiments described herein are not described with reference to any particular programming language. It will be appreciated that a variety of programming languages may be used to implement the teachings of the embodiments as described herein.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The components of the distributed antenna systems described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends on the particular application, design choices, and/or design constraints imposed on the overall system. Skilled artisans may implement the described functionality in varying ways for each particular application, but such implementation decisions should not be interpreted as causing a departure from the scope of the present embodiments.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA), or other programmable logic device, a discrete gate or transistor logic, discrete hardware components, or any combination thereof designed to perform the functions described herein. Furthermore, a controller may be a processor. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The embodiments disclosed herein may be embodied in hardware and in instructions that are stored in hardware, and may reside, for example, in RAM, flash memory, ROM, Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. Those of skill in the art will also understand that information and signals may be represented using any of a variety of technologies and techniques. For example, data, instructions, commands, information, signals, bits, symbols, and chips, that may be references throughout the above description, may be represented by voltages, currents, electromagnetic waves, magnetic fields, or particles, optical fields or particles, or any combination thereof.

Unless otherwise expressly stated, it is in no way intended that any method set forth herein be construed as requiring that its steps be performed in a specific order. Accordingly, where a method claim does not actually recite an order to be followed by its steps, or it is not otherwise specifically stated in the claims or descriptions that the steps are to be limited to a specific order, it is in no way intended that any particular order be inferred.

It will be apparent to those skilled in the art that various modifications and variations can be made without departing from the spirit or scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A wireless transceiver node in a distributed radio access network (RAN), comprising:
    a communication interface coupled to a server apparatus via a communication medium;
    a receive circuit coupled to the communication interface, the receive circuit configured to receive at least one radio frequency (RF) test signal in a selected receive band in a maintenance mode; and
    a controller communicatively coupled to the communication interface and the receive circuit, the controller configured to:
        receive the at least one RF test signal from the receive circuit;
        determine a predefined characteristic of the at least one RF test signal;
        determine an effective gain value based on the predefined characteristic;
        cause the receive circuit to convert the at least one RF test signal into a digital test signal based on the effective gain value and communicate the digital test signal to the server apparatus via the communication interface;
        communicate a gain descriptor comprising the effective gain value to the server apparatus via the communication interface;
        receive a common gain value via the communication interface; and
        cause the receive circuit to convert the at least one RF test signal into the digital test signal based on the common gain value.

2. The wireless transceiver node of claim 1, wherein the receive circuit comprises:
    a bandpass filter configured to pass the at least one RF test signal in the selected receive band and reject the at least one RF test signal outside the selected receive band;
    a low-noise amplifier (LNA) configured to amplify the at least one RF test signal to a receive power;
    a frequency converter configured to convert the at least one RF test signal from the selected receive band to a selected intermediate frequency (IF) band;
    a second bandpass filter configured to pass the at least one RF test signal in the selected IF band and reject the at least one RF test signal outside the selected IF band;
    a variable gain amplifier (VGA) corresponding to a minimum effective gain value and a maximum effective gain value, the VGA configured to convert the at least one RF test signal from the receive power to an effective power; and
    an analog-to-digital converter (ADC) corresponding to a defined dynamic range and configured to convert the at least one RF test signal into the digital test signal.

3. The wireless transceiver node of claim 2, wherein the receive circuit further comprises an in-phase (I)/quadrature (Q) (I/Q) demodulator configured to:
    generate a digital in-phase test signal and a digital quadrature test signal based on the digital test signal; and
    provide the digital in-phase test signal and the digital quadrature test signal to the communication interface.

4. The wireless transceiver node of claim 2, wherein the VGA is configured to convert the at least one RF test signal from the receive power to the effective power that falls within the defined dynamic range of the ADC and independent of the receive power of the at least one RF test signal.

5. The wireless transceiver node of claim 4, wherein the controller is further configured to:
    control the VGA to convert the receive power to the effective power based on the effective gain value greater than or equal to the minimum effective gain value and less than or equal to the maximum effective gain value; and
    communicate the gain descriptor further comprising the minimum effective gain value and the maximum effective gain value to the server apparatus via the communication interface.

6. The wireless transceiver node of claim 4, wherein the controller is further configured to:
    receive the common gain value between the minimum effective gain value and the maximum effective gain value from the server apparatus via the communication interface; and
    control the VGA to convert the receive power to the effective power based on the common gain value.

7. The wireless transceiver node of claim 1, wherein the receive circuit is further configured to:
    receive at least one uplink RF communications signal from a coupled antenna in an operation mode;
    convert the at least one uplink RF communications signal into an uplink digital communications signal; and
    communicate the uplink digital communications signal to the server apparatus via the communication interface.

8. The wireless transceiver node of claim 7, further comprising a transmit circuit configured to:
    receive a downlink digital communications signal from the server apparatus via the communication interface in the operation mode;
    convert the downlink digital communications signal into at least one downlink RF communications signal; and
    communicate the at least one downlink RF communications signal via the coupled antenna.

9. The wireless transceiver node of claim 8, wherein the controller is further configured to:
    retrieve a predefined transmit power from a neighbor relation table (NRT); and
    cause the transmit circuit to transmit the at least one downlink RF communications signal at the predefined transmit power.

10. A server apparatus in a distributed radio access network (RAN), comprising:
a server communication interface coupled to a plurality of wireless transceiver nodes via a communication medium; and
a control circuit communicatively coupled to the server communication interface, the control circuit configured to operate in a maintenance mode to:
receive one or more digital test signals in association with one or more gain descriptors from one or more selected wireless transceiver nodes among the plurality of wireless transceiver nodes via the server communication interface;
determine a common gain value for the one or more selected wireless transceiver nodes based on the one or more gain descriptors; and
communicate the common gain value to the one or more selected wireless transceiver nodes via the server communication interface.

11. The server apparatus of claim 10, wherein the control circuit is further configured to:
receive the one or more gain descriptors comprising one or more minimum effective gain values, one or more maximum effective gain values, and one or more effective gain values, respectively; and
determine the common gain value greater than or equal to each of the one or more minimum effective gain values and less than or equal to each of the one or more maximum effective gain values.

12. The server apparatus of claim 11, wherein the control circuit is configured to determine the common gain value by processing the one or more gain descriptors based on a least square algorithm with an inequality constraint.

13. The server apparatus of claim 12, wherein the least square algorithm with the inequality constraint is expressed as minimize $$\sum_{i=1}^{N} \text{abs}(\alpha - \alpha_i^{e\!f\!f})^2,$$

wherein:
N represents a count oldie one or more selected wireless transceiver nodes;
α represents the common gain value for the one or more selected wireless transceiver nodes;
$\alpha_i^{e\!f\!f}$ represents an effective gain value among the one or more effective gain values;
the inequality constraint is satisfied when the common gain value is greater than or equal to a largest minimum effective gain value among the one or more minimum effective gain values and less than or equal to a smallest maximum effective gain value among the one or more maximum effective gain values; and
the common gain value equals $$\left[\frac{1}{N}\sum_{i=1}^{N}\alpha_i^{e\!f\!f}\right][\alpha^{e\!f\!f}\min-\max, \alpha^{e\!f\!f}\max-\min].$$

14. The server apparatus of claim 11, wherein the control circuit is configured to determine the common gain value by processing the one or more gain descriptors based on a mean absolute deviation algorithm.

15. The server apparatus of claim 14, wherein the mean absolute deviation algorithm is expressed as minimized $$\sum_{i=1}^{N}\text{abs}(\alpha - \alpha_i^{e\!f\!f}),$$

wherein:
N represents a count of the one or more selected wireless transceiver nodes;
α represents the common gain value for the one or more selected wireless transceiver nodes;
$\alpha_i^{e\!f\!f}$ represents an effective gain value among the one or more effective gain values; and
the common gain value equals $[\text{median}\{\alpha^{e\!f\!f}\}]_{[\alpha^{e\!f\!f}min-max, \alpha^{e\!f\!f}max-min]}$ $(1<i<N)$.

16. The server apparatus of claim 11, wherein the control circuit is configured to determine the common gain value by processing the one or more gain descriptors based on a weighted least square algorithm.

17. The server apparatus of claim 16, wherein the weighted least square algorithm is expressed as minimize $$\sum_{i=1}^{N} w_i * \text{abs}(\alpha - \alpha_i^{e\!f\!f})^2,$$

wherein:
N represents a count of the one or more selected wireless transceiver nodes;
α represents the common gain value for the one or more selected wireless transceiver nodes;
$\alpha_i^{e\!f\!f}$ represents an effective gain value among the one or more effective gain values; and
$w_i$ represents a respective fractional weight factor assigned to each of the one or more selected wireless transceiver nodes.

18. The server apparatus of claim 10, further configured to operate in an operation mode, wherein the server apparatus further comprises:
a baseband unit (BBU) configured to:
receive a downlink composite digital communications signal from a core network communicatively coupled to the BBU; and
provide an uplink composite digital communications signal to the core network; and
a digital routing unit (DRU) coupled between the BBU and the server communication interface, the DRU configured to:
receive and convert the downlink composite digital communications signal into a plurality of downlink digital communications signals;
provide the plurality of downlink digital communications signals to the plurality of wireless transceiver nodes via the server communication interface;
receive a plurality of uplink digital communications signals from the plurality of wireless transceiver nodes via the server communication interface;
convert the plurality of uplink digital communications signals into the uplink composite digital communications signal; and
provide the uplink composite digital communications signal to the BBU.

* * * * *

UNITED STATES PATENT AND TRADEMARK OFFICE
CERTIFICATE OF CORRECTION

PATENT NO. : 10,790,903 B2
APPLICATION NO. : 16/268780
DATED : September 29, 2020
INVENTOR(S) : Kalle Ahmavaara et al.

It is certified that error appears in the above-identified patent and that said Letters Patent is hereby corrected as shown below:

In the Claims

In Column 21, Line 45 (approx.), Claim 13, delete "oldie" and insert -- of the --, therefor.

In Column 22, Line 16, Claim 15, delete "$\{\alpha^{eff}\}$" and insert -- $\{\alpha_i^{eff}\}$ --, therefor.

In Column 22, Line 17, Claim 15, delete "(1<i<N)." and insert -- ($1 \leq i \leq N$). --, therefor.

Signed and Sealed this
Twenty-first Day of September, 2021

Drew Hirshfeld
*Performing the Functions and Duties of the*
*Under Secretary of Commerce for Intellectual Property and*
*Director of the United States Patent and Trademark Office*